United States Patent [19]

Beitman et al.

[11] Patent Number: 4,951,102
[45] Date of Patent: Aug. 21, 1990

[54] TRENCH GATE VCMOS

[75] Inventors: Bruce A. Beitman, Palm Bay, Fla.; Charles F. Boucher, Sunnyvale, Calif.

[73] Assignee: Harris Corporation, Melbourne, Fla.

[21] Appl. No.: 235,543

[22] Filed: Aug. 24, 1988

[51] Int. Cl.$^5$ ............................................. H01L 29/78
[52] U.S. Cl. .................... 357/23.4; 357/23.1; 357/43; 357/49; 357/55
[58] Field of Search ............ 357/23.4, 23.1, 46, 357/55, 42, 43, 49, 47

[56] References Cited

U.S. PATENT DOCUMENTS

| 3,893,155 | 7/1975 | Ogiue | 357/42 |
| 4,296,429 | 10/1981 | Schroeder | 357/55 |
| 4,408,304 | 10/1983 | Nishizawa et al. | 357/43 |
| 4,751,561 | 6/1988 | Jastrzebski | 357/42 |

FOREIGN PATENT DOCUMENTS

| 0199251 | 12/1982 | Japan | 357/55 |
| 0149045 | 8/1984 | Japan | 357/46 |
| 0097661 | 5/1985 | Japan | 357/42 |
| 0226185 | 11/1985 | Japan | 357/23.4 |
| 0120064 | 6/1987 | Japan | 357/42 |

OTHER PUBLICATIONS

"A Trench MOSFET with Surface Source/Drain Contacts", IEDM-85, CH2252-5/85/0000-0200, 1985 IEEE.

"Trench Transistor Cell with Self-Aligned Contact (TSAC) for Megabit MOS Dram", IEDM '86, CH2381-2/86/0000-0132, 1986, IEEE.

"Characterisation of the Lateral and Vertical Parasitic . . . ", Elecrochemical Society Meeting, Abstract No. 274, pp. 411-412.

Primary Examiner—Rolf Hille
Assistant Examiner—Minh Loan Tran
Attorney, Agent, or Firm—Barnes & Thornburg

[57] ABSTRACT

VMOS transistors are formed with gate segments in dielectric trenches separating islands formed on a common dielectric base. A trench gate may be common for VMOS at opposed edges of adjacent islands, for VMOS at common edge of common islands or for VMOSs at uncommon edges of common islands. Common regions of an island may be used to form parallel or series VMOS with separate trench gates. The trenches may be formed after device region formation. Isolated gate segments may be formed by removing portions of dielectrically filled trenches to form recesses to be filled with gate material or forming gate material filled dielectric trenches and removing portions of the gate material and refilling with dielectric to form the isolated gate segments.

20 Claims, 8 Drawing Sheets

TRENCH GATE VCMOS

BACKGROUND AND SUMMARY OF THE INVENTION

The present invention relates generally to integrated circuits having complementary metal oxide field effect transistors (CMOS) and more specifically to an improved radiation hard integrated circuit including CMOS devices.

The formation of VMOS transistors, vertical MOS transistors, to minimize the effect or limitations of lithography on forming the channel length is illustrated by, for example, U.S. Pat. No. 4,296,429 to Schroeder. More recently, the vertical CMOS technology forms an MOS transistor on a silicon trench side wall. The trench side wall is oxidized to form the gate oxide and the remaining trench void is filled with doped polycrystalline which creates the MOSFET gate electrode. The vertical MOS concept is currently used to make NMOS or PMOS transistors in Japanese DRAMs. Placing the MOS structure in the vertical position satisfactorily reduces the active area required for the device. Therefore, vertical MOSFETs have significantly higher packing density over their standard counterpart.

However, state of the art vertical MOSFETs have a very limited application due to the bulk substrate used to fabricate them. While the bulk substrate acts as a common source or drain for all transistors, stacked transistor are impossible and only one type of MOS transistor can be fabricated on a wafer. Therefore, vertical transistors must be either NMOS or PMOS on bulk substrates. Typical examples of this are described in articles: "A Trench MOSFET With Surface Source/Drain Contacts", Nakajima et al., IEDM '85, pp. 200-203; and, "Trench Transistor Cell with Self-Aligned Contact (TSAC) for Megabyte MOS DRAM", Yanagisawa et al., IEDM '86, pp. 132-135.

The investigation of parasitic vertical MOS transistors resulting from trench isolated lateral CMOS processes is described in Abstract No. 274, "Characterization of the Lateral and Vertical Parasitic Transistors in a Trench Isolated CMOS Process", M. C. Roberts et al., Eletrochemical Society Meeting, pp. 411-412. This articles indicates that the parasitic vertical MOS transistors will either not operate because of the voltages of the circuit or can be minimized by appropriate well doping and side wall oxide thickness.

Thus, there exists a need to provide an integrated circuit which takes advantage of the vertical MOS transistors using the trench technology while maintaining the individual isolation of the isolated CMOS integrated devices.

Thus, it is an object of the present invention to provide an integrated circuit having high density and high speed digital integrated circuits.

Another object of the present invention is to provide a high density integrated circuit having both N and P channel devices on the same wafer with full dielectric isolation between individual devices.

An even further object of the present invention is to provide a method of fabricating submicron channel lengths.

A still further object of the present invention is to provide a method for fabricating complementary field effect transistors having low power mode of operation.

An even further object of the present invention is to provide a high density integrated circuit having complementary field effect transistors which are radiation hardened.

An even further object of the present invention is to provide a process which is capable of forming complementary field effect transistors as well as bipolar complementary transistors with suitable operating characteristics for digital integrated circuit applications.

These and other objects are achieved by using dielectrically isolated trenches with gate material therein to form a plurality of dielectrically isolated islands on a silicon-on-insulator (SOI) wafer. The buried oxide insulator offers the bottom dielectric isolation while the trenches offer the side wall isolation and side wall gates. The source, channel and drain regions are vertically aligned at the side walls of the trenches. Complementary MOS devices in adjacent islands may include a common gate material in the dielectric trenches which divide them. A buried high concentration impurity region reduces the parasitic resistance of the lower source or drain region at the bottom of the structure adjacent the base insulating layer. The lightly doped well creates a built-in lightly doped drain (LDD) structure. Diffused body and top source/drain regions for both N and P channel devices assure that the channel length is independent of the epitaxial thickness and the polysilicon gate width. This allows the device to be fabricated with very short lengths (i.e., submicron) without employing special lithographic tools. Submicron gate lengths will significantly increase speed.

A second gate segment isolated from the first gate segment along either a common or different vertical edge of an island using the same source, drain and channel regions will form two insulated gate field effect transistors having their source and drain regions connected in parallel with separate gates. An island having a common channel separating a common source and drain with a separate and distinct second pair of sources and drains and a pair of gates across the channel regions between the buried source and the top drain and between the buried drain and the top source produce two field effect transistors having their source/drain paths in series with separate gates. Both these structures can be interconnected to produce appropriate logic circuits, for example a NAND gate. The separate surface source and drains may be along a common vertical edge or different vertical edges. For a more symmetrical device, the top source or drain region may be separated from the vertical edge by a lower impurity concentration region to produce a lightly doped drain (LDD).

A process for fabricating the unique integrated circuit having the vertical MOS transistor includes selectively forming a plurality of spaced first and second conductivity type buried regions in a first layer of a semiconductor material which is separated from a substrate by a base dielectric layer. A second layer of semiconductor material of the first conductivity type is formed on the first layer. Impurities of the second conductivity type are selectively introduced into regions of the second layer juxtaposed the second conductivity type buried regions to form a plurality of first regions of a first conductivity type and second regions of second conductivity type in the second layer. This forms the low impurity wells which form the source/drain regions.

First and second conductivity type impurities are selectively introduced into the second and first regions respectively to form third and fourth regions which are the channel regions. First and second conductivity type impurities are selectively introduced into the fourth and third regions respectively to form fifth and sixth regions respectively which are the surface source/drain regions.

Vertical trenches are then formed into the first and second layer down to the base dielectric layer to form a plurality of islands. The trenches are filled with dielectric and gate materials to form isolated gate segments isolated from each other by dielectric isolation and from the vertical MOS transistors by gate insulation. On the non-MOS vertical MOS vertical edges, the gate segments are isolated by thicker field dielectric insulation.

The trenches may be formed before or after the selective impurity introduction to form the source and channel regions. The second layer is formed by low temperature epitaxy so as to substantially prevent an outdiffusion of the buried layers. The trenches may be formed by reactive ion etching.

The trenches may be totally filled with dielectric insulation which is selectively removed to form recesses in which the gate segments are to be formed. A portion of the trench oxide could be left at the base region of the trench becoming a pedestal oxide to the gate material. Gate material is then inserted to fill the recesses. Where gates are to be formed, the lateral edge of the second layer is exposed by removing the dielectric insulation and a gate insulation is formed on the vertical edge before filling with the gate material. If a gate is not to be formed on the opposed side, the opposed vertical edge is not exposed.

As an alternative, if the very low temperature EPI growth (plasma enhanced EPI growth) is used then the oxide at the base of the trench is not needed. Therefore, the trenches may also have gate insulation formed along the vertical edges of the first and second layer and filled with the gate material. The gate material is then selectively removed to form the gate segments separated by recesses and these recesses are filled with dielectric insulation. On the edges where gates are not to be formed, gate material is selectively removed along these vertical edges and are subsequently filled with dielectric insulation to form a field insulation along the previously exposed vertical edges and gate isolation on the opposed vertical edge.

Other objects, advantages and novel features of the present invention will become apparent from the following detailed description of the invention when considered in conjunction with the accompanying drawings.

DETAILED DESCRIPTION OF THE DRAWINGS

Figure 1A:
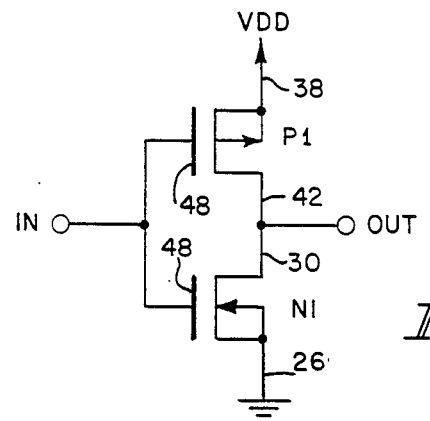
FIGS. 1a and 1b are a schematic and cross-sectional view, respectively, of an inverter incorporating the principles of the present invention.
Figure 1B:
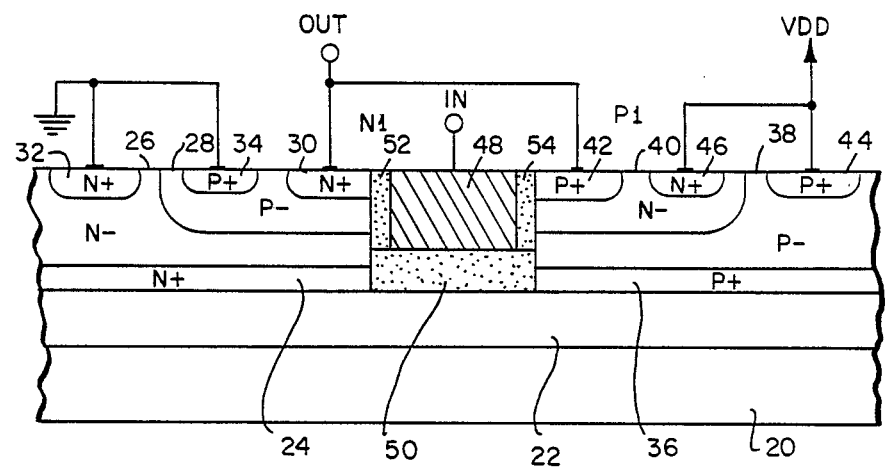

An inverter is illustrated in FIGS. 1a and 1b and includes a pair of complementary field effect transistors N1 and P1 having their source/drain regions connected in series between ground and VDD. Their gates are connected to the input terminal IN and their drains are connected to the output terminal OUT.

The integrated circuit includes a substrate 20 having a buried insulative layer 22 thereon and a plurality of dielectrical isolated regions on top of the buried insulative layer 22. This is a semiconductor on insulative (SOI) integrated circuit. The N channel transistor N1 includes a buried N+ region 24, an N− drain region 26, a P body/channel region 28 and an N+ source region 30. N+ region 32 and P+ region 34 form drain and body contacts respectively. The N+ region 30 forms the source contact. The P channel transistor P1 includes a P+ buried region 36, a P− drain region 38, an N− channel region 40 and a P+ source region 42. A P+ region 44 and an N+ region 46 form drain and channel contact regions respectively. The P+ channel 42 forms the source contact. The contact to the buried N+ and P+ regions are made from regions 32 and 44, respectively.

A common gate 48, made for example of doped polycrystalline silicon, is formed in a trench between the two transistors N1 and P1. A pedestal dielectric isolation region 50 separates the gate 48 from the buried oxide 22, buried regions 24 and 36 and a portion of the drain regions 26 and 38. This minimizes the overlap capacitance between the gate 48 and drains 26 and 38. If the drain layer is formed by low temperature processing reducing out diffusion from the buried regions 24 and 36, the pedestal dielectric region 50 may be eliminated. Gate oxide 52 and 54 laterally separate the gate 48 from the vertical edges of the trenches upon which the vertical transistors N1 and P1 are formed. The gate material 48 extends at least across the vertical length of the channel regions 28 and 40 at the vertical edges of the trench.

As can be seen, the unique circuit configuration will dramatically increase packing density and the initial shrinkage provided by the smaller active area required for the vertical MOS devices. Compact circuit design combined with ultra-thin gate lengths will further increase speed. The channel doping will have a gradient along the channel due to the body diffusion. Therefore, the threshold voltage will be lower towards the bottom of the device than at the top. If the MOS transistor is configured with the drain at the bottom of the structure, the device becomes more heavily inverted at the drain end of the channel. The deep inversion region is more difficult to pinch off. Therefore, the vertical device will have a larger saturation current than a device of comparable dimensions and a threshold voltage with a uniformly doped channel. These vertical MOS devices also eliminate the parasitic bottom field effect transistor which becomes very leaky over a total dose or prompt gamma irradiation offering increased radiation hardness. The buried N+ and P+ regions reduce the parasitic resistance of the drains at the bottom of the structure. The well doping which forms the lightly doped buried drain region creates a built in low diffused drain structure.

Figure 2A:
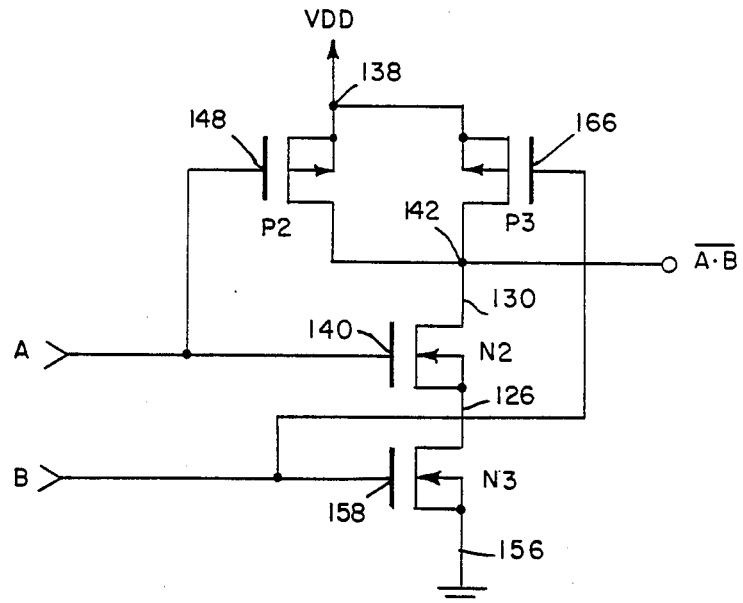
FIGS. 2a and 2b are a schematic and cross-sectional view, respectively, of a NAND gate according to the principles of the present invention.
Figure 2B:
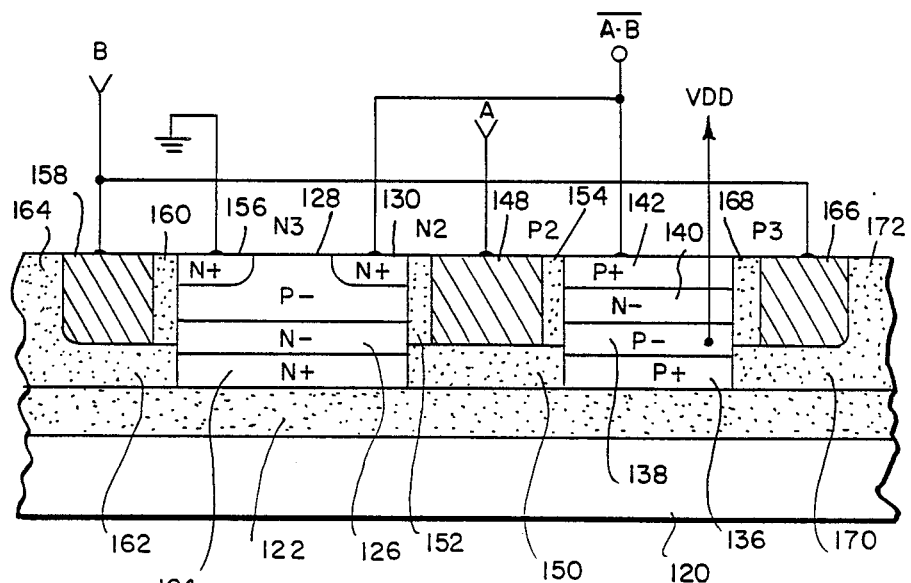

The ability to build more than one device in each island to further increase the density is illustrated in FIG. 2b for the two input NAND gate of FIG. 2a. It should be noted that the structure and elements of FIGS. 2a and 2b which are similar to FIGS. 1a and 1b have the same 10s and units numerals. The SOI includes a substrate 120 and a buried insulation layer 122. The first dielectric isolated island includes a buried N+ region 124, an N− region 126, a P− region 128 and surface N+ regions 130 and 156. The N− region 126 forms the drain of transistor N2 and the source of transistor N3. The region 128 forms a common body/channel region for transistors N2 and N3 and N+ regions 130 and 156 form the source and drain respectively of transistors N2 and N3. This produces the transistors N2 and N3 having their source drain regions connected in series.

The second dielectric isolated island includes a P+ buried region 136, a P− region 138, an N− region 140 and a P+ region 142. The P− region 138 forms the drain, N− region 140 forms the channel and P+ region 142 forms the source of transistors P2 and P3. This produces the two transistors P2 and P3 having their source and drain regions connected in parallel to each other.

The common gate structure for transistors N2 and P2 includes a gate 148 separated from N2 and P2 by gate insulation regions 152 and 154 respectively and a pedestal bottom trench dielectric region 150. The gate for transistor N3 includes a gate material 158 separated from N3 by gate insulative layer 160. Trench dielectric isolation regions 162 and 164 separate the gate 158 along its bottom and along the adjacent vertical walls of the trench respectively. The transistor P3 includes a gate 166 separated from P3 by gate insulation 168. Trench insulation 170 and 172 separate the gate 166 along its bottom and vertical edges of the trench. The three gates 148, 158 and 166 extend at least along the channel region of the respective transistors. Although not illustrated, the gates 148, 158 and 166, in the embodiment shown, are isolated from each other in their respective trenches.

Figure 2C:
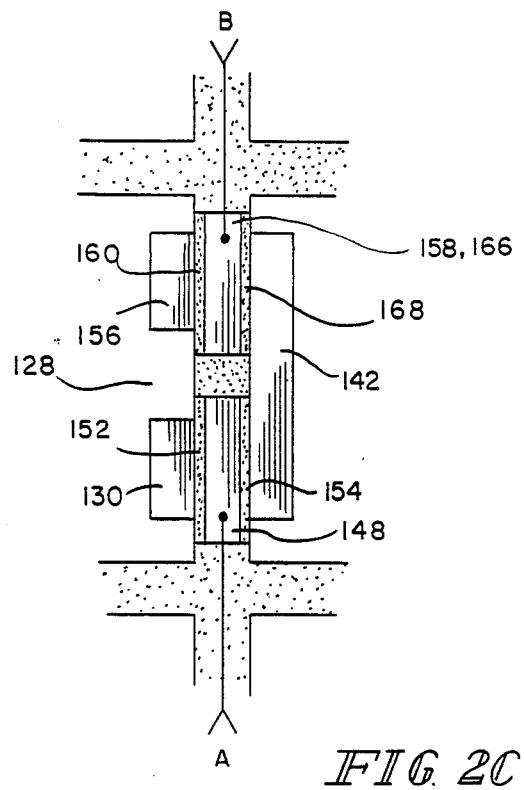
FIG. 2c is a plan view of a variation of FIG. 2b.

It should be noted that although the gates 166 and 158 are shown at opposed vertical edges of the islands opposite gate 148, they may also be formed at other vertical trench walls. For example, they may be at a wall orthogonal to the trench walls of 148. In that case, the surface drain region 156 of N3 would also be along the appropriate vertical wall for gate 158. As a further alternative, gates 158 and 166 may be a common gate along a common trench with gate 148 as illustrated in FIG. 2c.

Figure 3A:
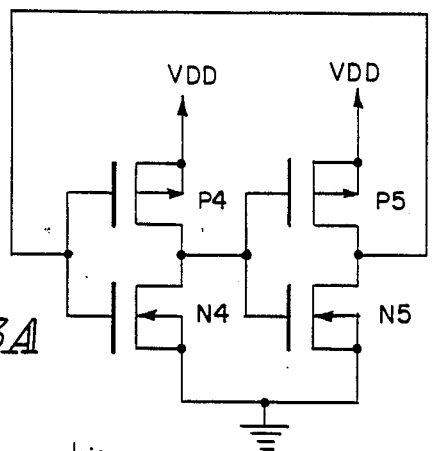
FIGS. 3a and 3b are a schematic and plan view, respectively, of a RAM cell including two inverters according to the principles of the present invention.
Figure 3B:
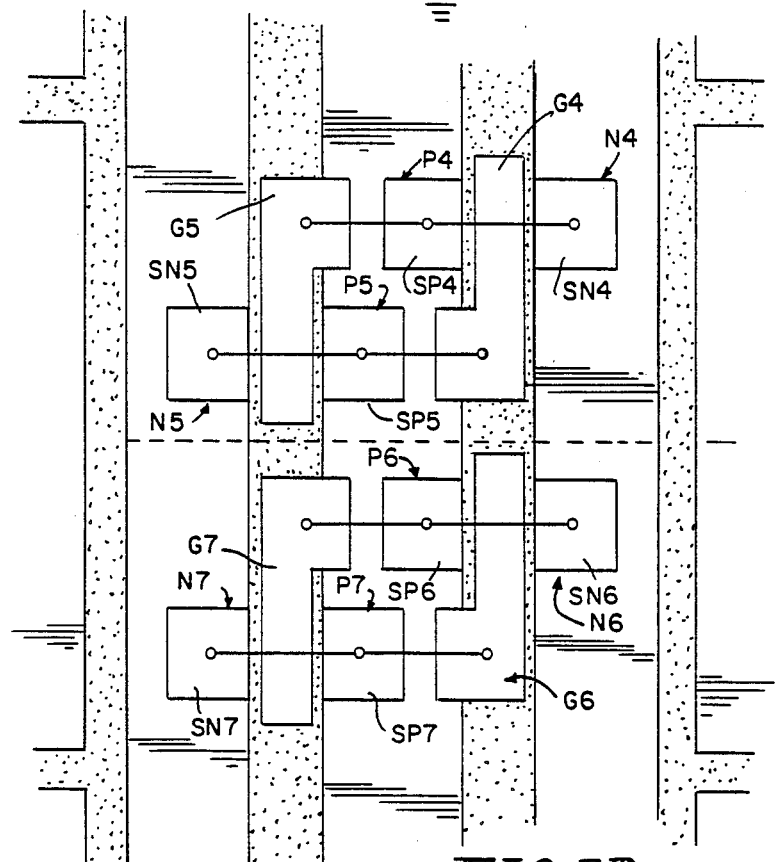

As a further example, a RAM cell is shown in FIGS. 3a and 3b. The RAM cell includes two inverters having their inputs and outputs connected together. The first inverter includes transistors N4 and P4 and the second inverter includes transistors N5 and P5. As illustrated within the plan view of FIG. 3b, a common gate G4 is in a trench separating drain SN4 and drain SP4 of transistors N4 and P4 respectively. A gate G5 separates the drains SN5 and SP5 of transistors N5 and P5 respectively. The drains SN4 and SP4 are connected to the gate of G5 and the drains SN5 and SP5 are connected to the gate of G4.

A second cell is illustrated as including two inverters and including transistors N6, P6, N7 and P7. The gates G6 and G7 are separated from gates G4 and G5 by trench oxide since they lie in the same trench. The channel or body regions and the buried junction drain regions of the P channel devices P4–P7 are common and thus, they may lie in a single dielectric isolated island. Along opposed edges of the dielectrically isolated island that include the P channel devices, lie two additional dielectrically isolated islands including the transistors N4 and N6 and N5 and N7 respectively. N4 and N6 may include a common channel or body and drain while N5 and N7 may also include a common body or channel and drain.

Figure 4:
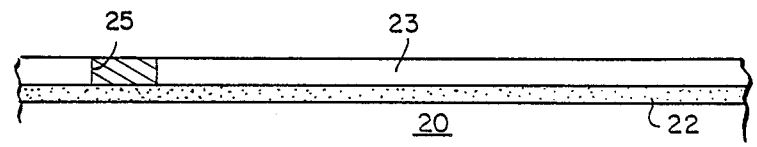
FIGS. 4-10 are cross-sectional views of a wafer at various stages of fabrication for forming dielectrically isolated islands according to the principles of the present invention.

The process for fabricating the vertical insulated gate field effect transistor of the present invention begins with a substrate 20, 23 shown in FIG. 4 as having a buried insulator 22 and a starting layer 23. The substrate 20 may be silicon having an oxide 22 and a starting layer of silicon 23. The oxide layer 22 can be in the range of 0.001 to 5 Microns, the oxide is not necessarily constrained to this thickness range, but may be more generally described, and the starting material or first layer 23 would have a thickness in the range of 0.1 to 1.0 Microns. This starting structure may be formed by high dose oxygen implantation (SIMOX), bonded wafers or ZMR wafers. It could also be formed by SOS, or Si on other insulators, such as $CaF_2$, for instance.

The SIMOX wafers are fabricated by implanting a high dose of oxygen directly into a wafer and following the implant with a high temperature annealing process. This results in a buried silicon dioxide layer in the range of 3,000 to 4,000 Angstroms thick with a silicon layer about 1,000–2,000 Angstroms thick overlying it. These wafers will then have a thin expitaxial film grown thereon before the trenches are formed.

Bonded wafers are formed by placing two oxidized silicon wafers together and annealing at high temperature for several hours. This forms a strong bond resulting in a silicon dioxide-silicon structure. One of the wafers is then ground mechanically and/or chemically back until the silicon layer of the desired thickness is left above the oxide. The structure is then ready for trans- formation.

ZMR wafers are formed by first fabricating a sandwich consisting of a layer of polysilicon in the layer of 0.2 to 1 Microns thick on top of an oxidized wafer. More oxide is then deposited on top of the polysilicon. A localized energy source, such as a strip heater or laser, is scanned across the wafer recrystallizing the polycrystalline film forming a silicon film that is predominantly single crystal in character. These wafers are also ready for transformation without the additional epitaxial step.

This process will be described starting with a thin layer 23 so that buried N+ and P+ regions may be formed. As illustrated in FIG. 4, the substrate 20 of thin oxide layer 22 and a first layer of silicon 23 is formed thereon. An alignment mark 25 is etched in the first layer 23.

Figure 5:
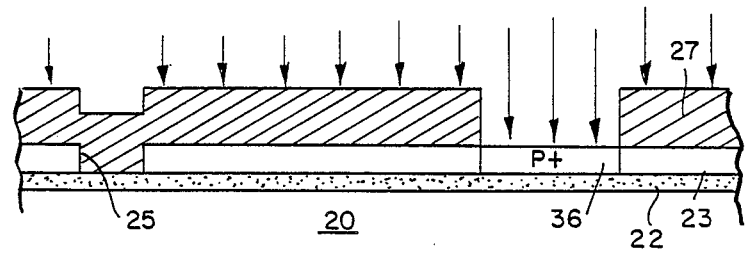
Figure 6:
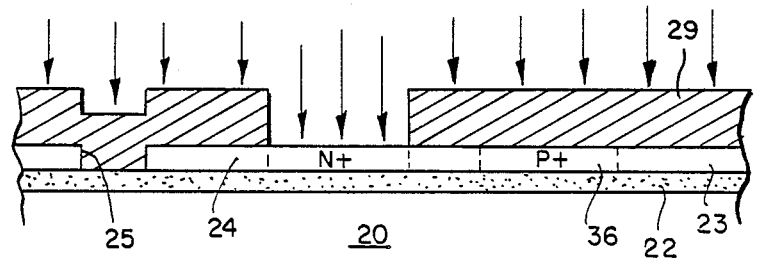

A mask, for example photoresist, is then applied and an opening is formed for a first set of buried regions. P type impurities are then introduced, by ion implantation for example, to form the buried P+ regions 36 as illustrated in FIG. 5. Oxide may be deposited on the first layer 23 prior to the masking step if desired for added masking. A second mask 29 is then applied with openings formed therein for the N+ buried layer regions. N+ impurities are then ion implanted to form the N+ regions 24 as illustrated in FIG. 6.

Figure 7:
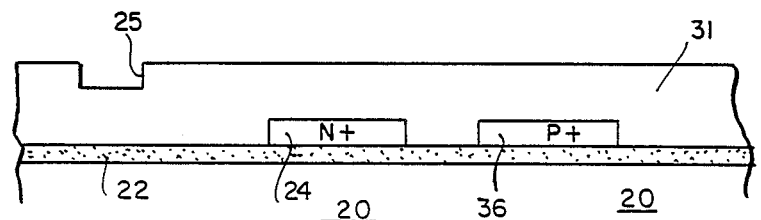
Figure 8:
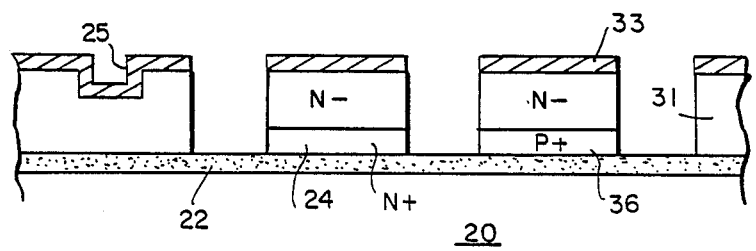

An N− epitaxial layer 31 is grown at low temperature to prevent up diffusion of the implanted buried regions 24 and 36. The epitaxial deposition may be performed by slow plasma enhanced low temperature epitaxy in the range of 800° to 950° C. The resulting thickness of epitaxial layer is in the range of 0.3 to 1.0 Microns. At this point, as illustrated in FIG. 7, the epitaxial layer has been grown and the alignment mark is preserved during the epitaxial growth.

Figure 9:
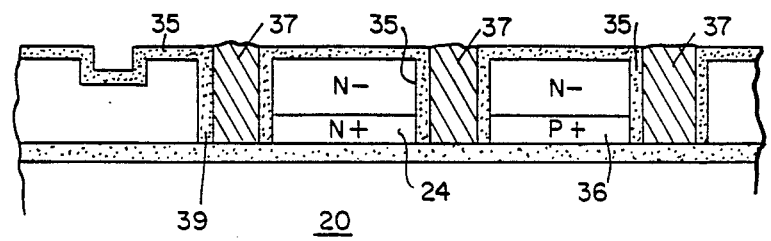

A mask layer 33 is applied with openings to define the trenches. A dry trench etch is performed by for example reactive ion etching. This produces substantially vertical trench walls and divides the layer 31 into a plurality of mesas with appropriate buried regions 34 and 36. A layer of thin gate oxide 35 of approximately 200 Angstroms, for example, is formed along the vertical walls of the trenches by oxidation. An insignificant amount of oxide is formed at the bottoms of the trenches. The trenches are then refilled with doped polycrystalline silicon 37 which is planarized as illustrated in FIG. 9. The polycrystalline silicon may be doped with boron which can then be diffused through the gate oxide to serve as a counter dope step to set the threshold voltages of the MOS devices.

Figure 10:
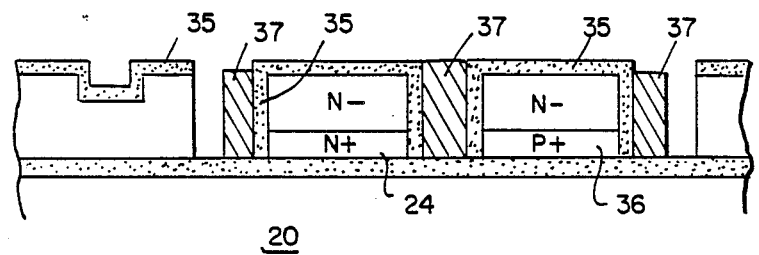

Along vertical edges of the trenches in which no MOS device will be formed, the polycrystalline material 37 is removed as illustrated in FIG. 10. Portions of the polycrystalline material are also removed to form gate segments which are subsequently filled with thicker dielectric material. This forms gate segments which are dielectrically isolated from each other as well as non-MOS device walls by thick dielectric insulation and from MOS side walls by thin gate insulation. These recesses are then filled with dielectric insulation which results in a thicker dielectric insulation along the non-gate edges of the trench to the islands, and subsequently planarized by plasma etch back.

Since the epitaxial layer 31 was formed by a low temperature process, the up diffusion of impurities from the buried layers 24 and 36 was significantly reduced. Thus, the depth of the epitaxial layer 31 can be minimized. Also, the pedestal dielectric layer is no longer needed since the impurity concentration of the epitaxially layer 31 and adjacent the buried layer is not adversely affected. Using the more standard high temperature epitaxial deposition in the temperature ranges of 1050° to 1200° C., the impurities of the buried layers 24 and 36 up diffuse significantly, especially the P−type impurities. Thus, the epitaxial layer 31 must be formed thicker in the range of 0.8 to 2.0 microns. Also, the process must include the formation of the pedestal dielectric layer 50 to reduce the overlap capacitance.

Figure 11:
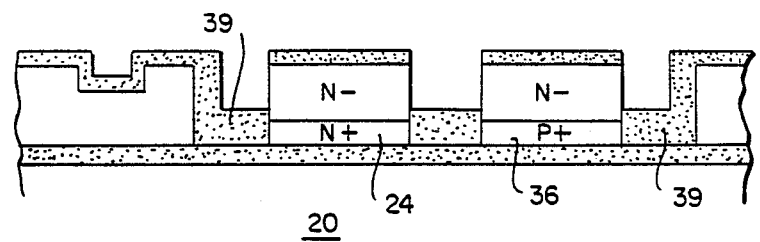
FIGS. 11 and 12 are cross-sectional views of alternatives to the steps of FIGS. 9 and 10.
Figure 12:
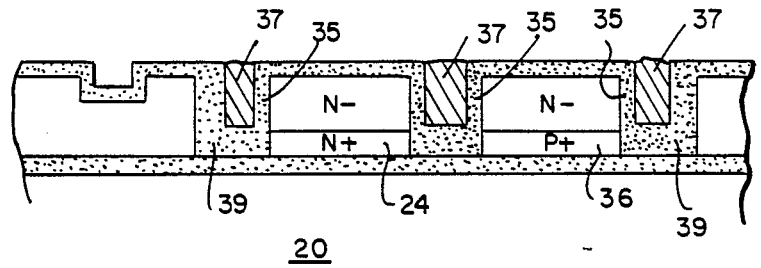

As an alternative to the previous process and especially for epitaxial layers formed using high temperatures, the gates and respective dielectric insulation may be formed by filling the trenches with dielectric insulation, and planarizing. A mask is formed and the trenches are etched to expose the vertical edges of the MOS devices and create a recess to receive the gate dielectric and the gate material leaving a pedestal in the bottom of the trenches. This is illustrated in FIG. 11. The exposed edges are then oxidized to form the gate oxide and are then filled with polycrystalline silicon. The resulting structure, as shown in FIG. 12, is then planarized. The recesses are formed to form dielectric isolated gate segments.

For example, plasma planarization techniques can be used to etch back the polycrystalline silicon and the oxide leaving these materials in the trenches but removing them from other areas of the wafer and resulting in a planar morphology.

Figure 13:
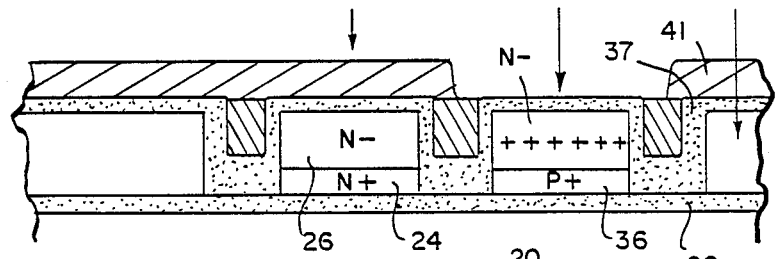
FIGS. 13-17 are cross-sectional views of a wafer at various stages of fabrication to form the vertical MOS devices according to the principles of the present invention.
Figure 14:
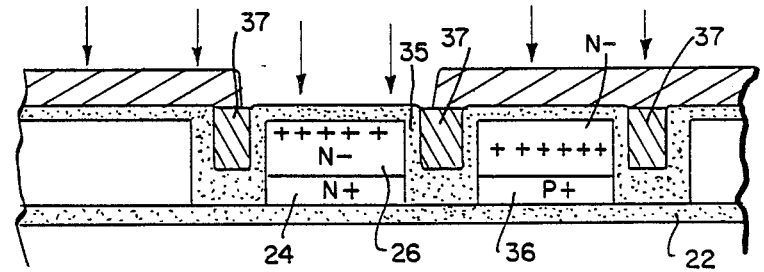
Figure 15:
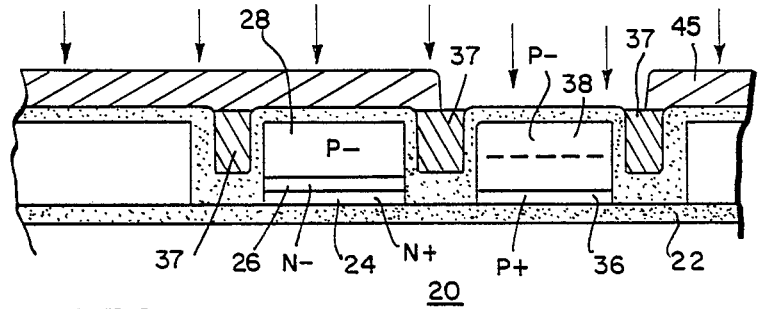
Figure 16:
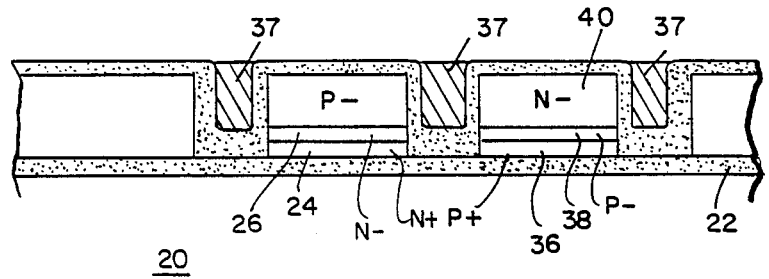

Using either process for forming the mesas and trench gate structure, the active devices are formed as follows. A mask 41, for example photoresist, is formed and openings are provided therein for the islands having the P− buried layer 36. P−type impurities at high energy are ion implanted to produce P source/drain regions as illustrated in FIG. 13. This is followed by a second photoresist mask 43 exposing the regions having N+ buried regions 24 and P−type impurities are ion implanted at a low energy for the body diffusion. This structure is illustrated in FIG. 14. The two P−type ion implantations are activated and diffused resulting in the P− region 28 which will form the body and channel of the NMOS device and the P− region 38 which forms the source/drain of the P channel device. A mask 45 is formed having an opening exposing the island having P− region 38 and N type impurities are implanted for the body. This is illustrated in FIG. 15. The N− impurities are then diffused resulting in region 40. The resulting structure is illustrated in FIG. 16.

Figure 17:
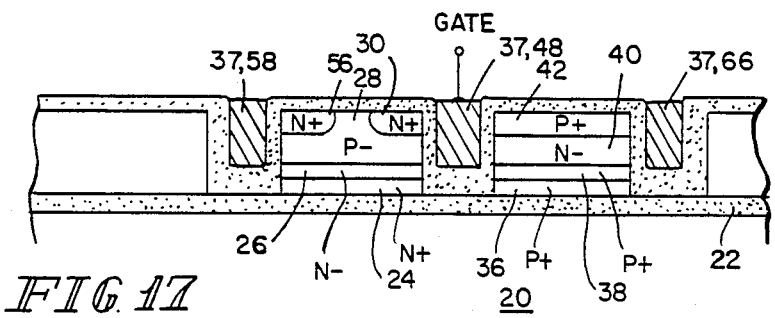

Additional masks are formed and P+ and N+ impurities are ion implanted to form surface source/drain regions 30, 42 and 56, as well as body and drain contact regions. The resulting structure is illustrated in FIG. 17.

Figure 18:
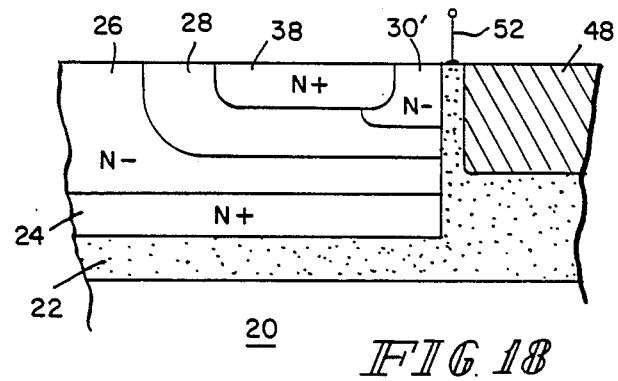
FIG. 18 is a cross-sectional view of a symmetrical vertical field effect transistor according to the principles of the present invention.

A more symmetrical vertical MOS transistor is created with lightly doped drains at both sides of the transistors. As discussed previously, the N− source/drain region 26 provides a natural lightly doped drain (LDD). The surface source/drain may be displaced from the edge of the trench and an N− lightly doped drain section 30′ may be formed between the N+ source/drain 30 and the vertical edge of the trench. This structure is illustrated in FIG. 18.

Although it has been discussed using an N+ buried region, a buried refractory metal or metal silicide may be used, for example, tungsten-silicide. This is possible with the bonded wafer technique of forming the starting material.

Figure 19:
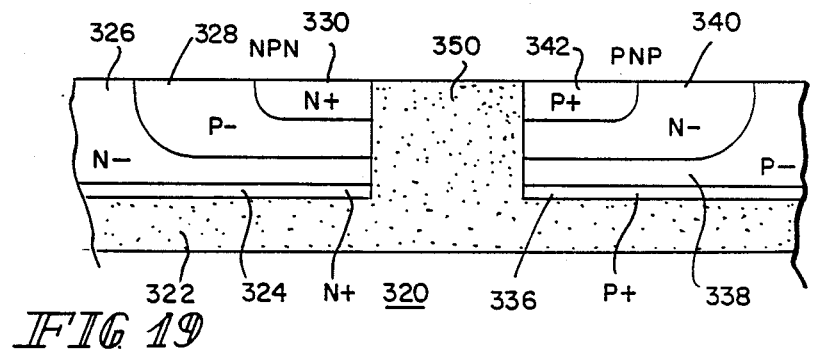
FIG. 19 is a cross-sectional view of a pair of complementary bipolar transistors according to the principles of the present invention.

Bipolar transistors may also be formed using the same processing steps as those to form the vertical MOS devices with no additional processing steps. As illustrated in FIG. 19, an NPN and PNP transistor are formed on a substrate 320 having a buried dielectric insulation layer 322. The NPN transistor has a buried N+ layer 324, an N− collector region 326, a P− base region 328 and an N+ emitter region 330. The PNP transistor includes a buried P+ region 336, a P− collector region 338, an N− base region 340 and a P+ emitter region 342. Depending upon the processing steps used, the NPN and PNP transistors are separated laterally by a dielectric trench 350. The trench 350 may also include a polycrystalline center portion.

Figure 20:
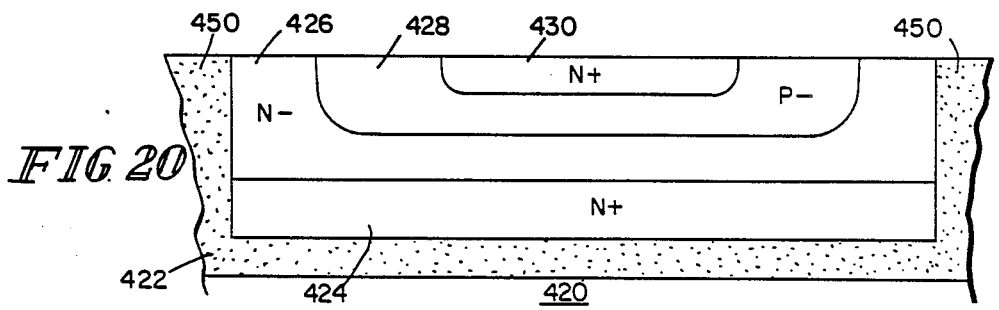
FIG. 20 is a cross-sectional view of a junction field effect transistor according to the principles of the present invention.

Similarly, a junction field effect transistor may also be formed as illustrated in FIG. 20. The junction field effect transistor would be formed on a substrate 420 having a buried dielectric isolation layer 422. The junction field effect transistor includes an N− bottom gate 426 with an N+ buried layer 424. The P— channel, source and drain region 428 and an N+ top gate 430.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. An integrated circuit comprising:
   base insulative layer;
   a plurality of semiconductor islands on said base insulative layer separated laterally by dielectric trenches along vertical edges of said islands;
   a first MOS transistor in a first island having, along a first vertical edge of a first dielectric trench, drain and source regions of the same conductivity type separated by a channel region of an opposite conductivity type;
   a second MOS transistor in a second island separated from said first island vertically by said first trench and having, along a second vertical edge of said first dielectric trench, drain and source regions of the same conductivity type separated by a channel region of an opposite conductivity type; and
   a first gate in said first dielectric trench, separated from said first and second vertical edges of said first trench by gate dielectric layers and extending vertically at least across a vertical length of said channel regions, at said first and second vertical edges to form a common first gate for said first and second MOS transistors.

2. An integrated circuit according to claim 1, wherein said islands, trenches and gates have coplanar top surfaces.

3. An integrated circuit according to claim 1, wherein said gate material is doped polycrystalline semiconductor material.

4. An integrated circuit according to claim 1, wherein said drain, gate and source regions have increasing levels of impurity concentration beginning at said base insulative layer.

5. An integrated circuit according to claim 4, including first and second buried regions, in said first and second islands along said first and second vertical edges respectively on said base insulative layer, of the same conductivity type as and higher impurity concentration than a respective vertically adjacent region.

6. An integrated circuit according to claim 5, wherein said gate terminates before said first and second buried regions.

7. An integrated circuit according to claim 4, wherein said source which is at a top surface of said respective islands includes a first region of a first conductivity type at a respective vertical edge and a second region spaced from said respective vertical edges by said first region and of said first conductivity type and a higher impurity concentration than said first region.

8. An integrated circuit according to claim 1, including a third MOS transistor in said first island having drain and channel regions common to and of the same conductivity type of said drain and channel regions respectively of said first MOS transistor and a source region of the same conductivity type separate and spaced from the source region of said first MOS transistor and a third gate in said first dielectric trench separated from said first and second vertical edges by a gate dielectric layer and from said first gate by dielectric isolation and extending vertically at least across the vertical length of said channel region of said third transistor at said first vertical edge to form a third gate for said third MOS transistor.

9. An integrated circuit according to claim 1, wherein said source, channel and drain regions in said first island extend from said first vertical edge of said first trench to a third vertical edge of a second dielectric trench to form source, channel and drain regions respectively of a third MOS transistor at said third vertical edge; and
   a second gate in said second dielectric trench, separated from said third vertical edge of said second trench by gate dielectric and from said first gate by dielectric isolation and extending vertically at least across the vertical length of said channel region at said third vertical edge to form a second gate for said third MOS transistor.

10. An integrated circuit according to claim 9, wherein said channel and drain regions in said second island extend from said second vertical edge of said first trench to a fourth vertical edge of a third dielectric trench to form channel and source regions respectively of a fourth MOS transistor;
    a drain region of said fourth MOS transistor has the same conductivity type as said source region of said second MOS transistor and is at said fourth vertical edge separate and spaced from said source region of said second MOS transistor at said second vertical edge; and
    a third gate in said third dielectric trench separated from said fourth vertical edge of said third trench by gate dielectric and from said first and second gates by dielectric isolation and extending vertically at least across the vertical length of said channel at said fourth vertical edge to form a third gate for said fourth MOS transistor.

11. An integrated circuit comprising:
    base insulative layer;
    a plurality of semiconductor islands on said base insulative layer separated laterally by dielectric trenches along vertical edges of said islands;
    a first MOS transistor in a first island having, along a first vertical edge of a first dielectric trench, a first drain region of a first conductivity type, a first channel region of a second conductivity type and a first source region of said first conductivity type;
    a first gate in said first trench separated from said first vertical edge of said first trench by gate dielectric layer and extending vertically at least across the vertical length of said first channel region at said first vertical edge to form a first gate of said first MOS transistor;
    a second MOS transistor in said first island having, along a second vertical edge of a second dielectric trench a second drain region of said first conductivity type common to said first source region, a second channel region of said second conductivity type common to said first channel region and a second source region of said first conductivity type separate and spaced from said first drain region; and
    a second gate in said second trench separated from said second vertical edge of said second trench by gate dielectric layer and said first gate by dielectric isolation and extending vertically at least across the vertical length of said second channel region at said second vertical edge to form a second gate of said second MOS transistor.

12. An integrated circuit according to claim 11, wherein said islands, trenches and gates have coplanar top surfaces.

13. An integrated circuit according to claim 11, wherein said gate material is a doped polycrystalline semiconductor material or a conductive material.

14. An integrated circuit according to claim 11, wherein said drain, gate and source regions have increasing levels of impurity concentration beginning at said base insulative layer.

15. An integrated circuit according to claim 14, including a buried region of said first conductivity type in said first island on said base insulative layer extending between said first and second vertical edges and of a higher impurity concentration than a vertically adjacent region.

16. An integrated circuit according to claim 15, wherein said first and second gates terminate before said buried layer.

17. An integrated circuit according to claim 14, wherein said source region which is at a top surface of said respective islands includes a first region of a first conductivity type at a respective vertical edge and a second region spaced from said respective vertical edges by said first region and of said first conductivity type and a higher impurity concentration than said first region.

18. An integrated circuit according to claim 11, including:
a third MOS transistor in a second island having, along a third vertical edge of said first trench, third drain and third source regions of said third conductivity type separated by a channel region of a fourth conductivity type;
said first gate being separated from said third vertical edge by gate dielectric layer and extending vertically at least across said third channel region at said third vertical edge to form a common first gate of said first and third MOS transistors.

19. An integrated circuit comprising:
base insulative layer;
a plurality of semiconductor islands on said base insulative layer separated laterally by dielectric trenches along vertical edges of said islands;
an N MOS transistor in a first island having, along a first vertical edge of a first dielectric trench, N—type drain, P—type channel and N—type source regions;
a P MOS transistor in a second island separated from said first island vertically by said first trench and having, along a second vertical edge of said first dielectric trench, P—type drain, N—type channel and P—type source regions;
a first gate in said first dielectric trench, separated from said first and second vertical edges of said first trench by gate dielectric layers and extending vertically at least across a vertical length of said channel regions, at said first and second vertical edges to form a common first gate for said N and P MOS transistors; and
said N and P MOS transistors forming an inverter having an input connected to said common first gate, drain regions of said N and P MOS transistors being connected to an output and source regions of said N and P MOS transistors being connected to first and second reference voltages respectively.

20. An integrated circuit according to claim 19 wherein said N—type channel and P—type drain regions in said second island extend from said second vertical edge of said first trench to a third vertical edge of a third dielectric trench to form N—type channel and P—type source regions respectively of a third P MOS transistor;
a P—type drain region of said third P MOS transistor is at said third vertical edge separate and spaced from said P—type source region of said P MOS transistor at said second vertical edge; and
a third gate in said third dielectric trench separated from said third vertical edge of said third trench by gate dielectric and from said first and second gates by dielectric isolation and extending vertically at least across the vertical length of said channel at said third vertical edge to form a third gate for said third MOS transistor.

* * * * *